United States Patent
Fukuda et al.

(10) Patent No.: US 12,520,704 B2
(45) Date of Patent: Jan. 6, 2026

(54) DISPLAY DEVICE HAVING A PARTITION PROVIDED ON A RIB COVERING A PART OF A LOWER ELECTRODE AND MANUFACTURING METHOD THEREOF

(71) Applicant: Magnolia White Corporation, Tokyo (JP)

(72) Inventors: Kaichi Fukuda, Tokyo (JP); Hiroshi Ogawa, Tokyo (JP); Nobuo Imai, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 346 days.

(21) Appl. No.: 18/158,474

(22) Filed: Jan. 24, 2023

(65) Prior Publication Data
US 2023/0240117 A1    Jul. 27, 2023

(30) Foreign Application Priority Data
Jan. 27, 2022   (JP) ................................ 2022-011096

(51) Int. Cl.
*H10K 59/80* (2023.01)
*H10K 59/35* (2023.01)
*H10K 71/00* (2023.01)
*H10K 102/00* (2023.01)

(52) U.S. Cl.
CPC ....... *H10K 59/8721* (2023.02); *H10K 59/353* (2023.02); *H10K 71/00* (2023.02); *H10K 2102/351* (2023.02)

(58) Field of Classification Search
CPC .. H10K 59/8721; H10K 59/353; H10K 71/00; H10K 2102/351; H10K 59/80522; H10K 59/122; H10K 59/1201; H10K 59/8051; H10K 59/8052; H10K 59/873;
(Continued)

(56) References Cited

U.S. PATENT DOCUMENTS

| | | |
|---|---|---|
| 6,137,220 A | 10/2000 | Nagayama et al. |
| 6,373,187 B1 | 4/2002 | Nagayama et al. |
| 2004/0160170 A1 | 8/2004 | Sato et al. |

(Continued)

FOREIGN PATENT DOCUMENTS

| | | |
|---|---|---|
| CN | 111326675 A | 6/2020 |
| JP | 2000-195677 A | 7/2000 |

(Continued)

OTHER PUBLICATIONS

JP-2008135325-A (Year: 2008).*

(Continued)

*Primary Examiner* — J. E. Schoenholtz
(74) *Attorney, Agent, or Firm* — XSENSUS LLP

(57) ABSTRACT

According to one embodiment, a display device includes a lower electrode, a rib including an aperture overlapping the lower electrode, a partition on the rib, an upper electrode which is in contact with the partition, an organic layer between the lower electrode and the upper electrode, and a sealing layer above the upper electrode. The partition includes a lower portion provided on the rib, and an upper portion provided on the lower portion and including an end portion protruding from a side surface of the lower portion. The upper portion contains at least one of a conductive oxide and titanium.

18 Claims, 13 Drawing Sheets

(58) Field of Classification Search
CPC . H10K 71/231; H10K 71/60; H01L 21/32139
See application file for complete search history.

(56) References Cited

U.S. PATENT DOCUMENTS

| | | |
|---|---|---|
| 2009/0009069 A1 | 1/2009 | Takata |
| 2013/0001620 A1 | 1/2013 | Sugisawa et al. |
| 2016/0190508 A1* | 6/2016 | Nakamura ........... H10K 50/844 |
| | | 257/40 |
| 2018/0130972 A1 | 5/2018 | Sonoda et al. |
| 2019/0363275 A1 | 11/2019 | Ochi et al. |
| 2021/0036073 A1 | 2/2021 | Cho et al. |
| 2022/0416197 A1 | 12/2022 | Chen |
| 2023/0240118 A1* | 7/2023 | Fukuda .............. H10K 59/8721 |
| | | 257/40 |

FOREIGN PATENT DOCUMENTS

| | | | |
|---|---|---|---|
| JP | 2001006879 A | | 1/2001 |
| JP | 2004-207217 A | | 7/2004 |
| JP | 3570857 B2 | | 7/2004 |
| JP | 2008-135325 A | | 6/2008 |
| JP | 2009-32673 A | | 2/2009 |
| JP | 2010-118191 A | | 5/2010 |
| JP | 2013030467 A | | 2/2013 |
| KR | 20010012714 A | | 2/2001 |
| KR | 20070050757 A | | 5/2007 |
| KR | 10-2012-0118266 A | | 10/2012 |
| KR | 20130049728 A | | 5/2013 |
| KR | 20140085326 A | | 7/2014 |
| KR | 10-2021-0016145 A | | 2/2021 |
| KR | 10-2023-0172031 A | | 12/2023 |
| WO | 2015111181 A1 | | 7/2015 |
| WO | 2018/179308 A1 | | 10/2018 |
| WO | 2022/225657 A1 | | 10/2022 |

OTHER PUBLICATIONS

Notice of Intent to Provide Information issued Sep. 4, 2024, in corresponding Korean Patent Application No. 10-2023-0010104, 6 pages.
Indian Office Action issued Apr. 22, 2024, in corresponding Indian Patent Application No. 202314004767, 5pp.
Hearing Notice, IN Application No. 202314004767, Mar. 27, 2025, 3 pages.
Korean Office Action issued Apr. 28, 2025, in KR Application No. 10-2023-0010104, 21pp.

* cited by examiner

| | | Practical example 1 | Practical example 2 | Practical example 3 | Practical example 4 |
|---|---|---|---|---|---|
| Upper portion (50~300nm) | Second layer | ITO | ITO | ITO | ITO |
| | First layer | Ti | Ti | Ti | Ti |
| Lower portion (400~1500nm) | Metal layer | Al | Al | Al | Al |
| | Barrier layer | Mo | MoW | Cu | - |
| Example of thickness of each layer | | ITO :50nm<br>Ti :100nm<br>Al :950nm<br>Mo :50nm | ITO :50nm<br>Ti :100nm<br>Al :800nm<br>MoW:200nm | ITO :50nm<br>Ti :100nm<br>Al :950nm<br>Cu :50nm | ITO :50nm<br>Ti :100nm<br>Al :1000nm |

|  |  | Practical example 5 | Practical example 6 | Practical example 7 | Practical example 8 |
|---|---|---|---|---|---|
| Upper portion (100~500nm) | | Ti | Ti | Ti | Ti |
| Lower portion (400~1500nm) | Metal layer | Al | Al | Al | Al |
| | Barrier layer | Mo | MoW | Cu | - |
| Example of thickness of each layer | | Ti :200nm<br>Al :950nm<br>Mo :50nm | Ti :200nm<br>Al :800nm<br>MoW:200nm | Ti :200nm<br>Al :950nm<br>Cu :50nm | Ti :200nm<br>Al :1000nm |

FIG. 18

|  |  | Practical example 9 | Practical example 10 | Practical example 11 | Practical example 12 |
|---|---|---|---|---|---|
| Upper portion (100~500nm) | Second layer | SiO | SiO | SiO | SiO |
| | First layer | Ti | Ti | Ti | Ti |
| Lower portion (400~1500nm) | Metal layer | Al | Al | Al | Al |
| | Barrier layer | Mo | MoW | Cu | - |
| Example of thickness of each layer | | SiO :250nm<br>Ti :50nm<br>Al :950nm<br>Mo :50nm | SiO :250nm<br>Ti :50nm<br>Al :800nm<br>MoW:200nm | SiO :250nm<br>Ti :50nm<br>Al :950nm<br>Cu :50nm | SiO :250nm<br>Ti :50nm<br>Al :1000nm |

FIG. 19

DISPLAY DEVICE HAVING A PARTITION PROVIDED ON A RIB COVERING A PART OF A LOWER ELECTRODE AND MANUFACTURING METHOD THEREOF

CROSS-REFERENCE TO RELATED APPLICATIONS

This application is based upon and claims the benefit of priority from Japanese Patent Application No. 2022-011096, filed Jan. 27, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

In the process of manufacturing the above display device, a technique of preventing the reduction in reliability has been required.

BRIEF DESCRIPTION OF THE DRAWINGS

FIG. 18 is a chart showing practical examples 5 to 8.
FIG. 19 is a chart showing practical examples 9 to 12.

DETAILED DESCRIPTION

Figure 1:
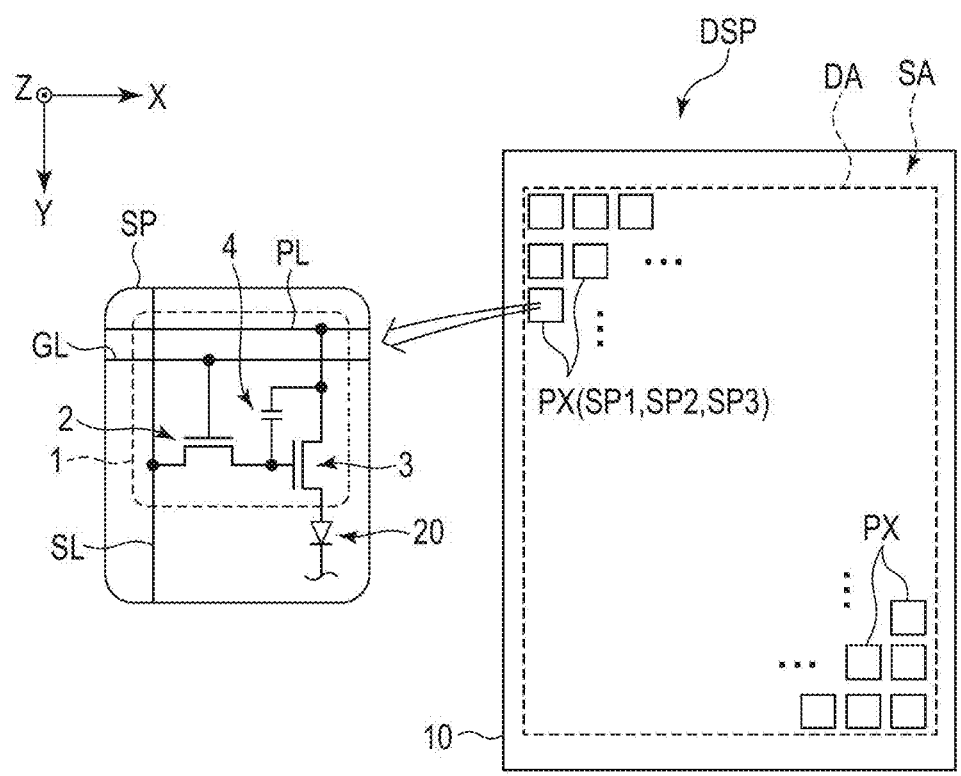
FIG. 1 is a diagram showing a configuration example of a display device according to an embodiment.

In general, according to one embodiment, a display device comprises a lower electrode, a rib which covers part of the lower electrode and comprises an aperture overlapping the lower electrode, a partition provided on the rib, an upper electrode which faces the lower electrode and is in contact with the partition, an organic layer located between the lower electrode and the upper electrode and emitting light based on a potential difference between the lower electrode and the upper electrode, and a sealing layer located above the upper electrode. The partition comprises a lower portion provided on the rib, and an upper portion provided on the lower portion and comprising an end portion protruding from a side surface of the lower portion. The upper portion contains at least one of a conductive oxide and titanium.

According to another embodiment, a manufacturing method of a display device comprises forming a lower electrode, forming a rib which covers at least part of the lower electrode, forming a partition comprising a lower portion provided on the rib, and an upper portion containing at least one of a conductive oxide and titanium and protruding from a side surface of the lower portion, forming an organic layer on the lower electrode, forming an upper electrode which is in contact with the partition and is located on the organic layer, forming a sealing layer on the upper electrode, forming a resist on the sealing layer, and removing, of the organic layer, the upper electrode and the sealing layer, a portion exposed from the resist by etching using the resist as a mask.

Theses configurations can prevent the reduction in the reliability of a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. A plan view is defined as appearance when various elements are viewed parallel to the third direction Z.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP according to an embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in a plan view is not limited to a rectangular shape and may be another shape such as a square shape, a circular shape or an elliptic shape.

The display area DA comprises a plurality of pixels PX arrayed in matrix in the first direction X and the second direction Y. Each pixel PX includes a plurality of subpixels SP. For example, each pixel PX includes a red subpixel SP1, a green subpixel SP2 and a blue subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element. For example, subpixel SP1 comprises a display element 20 which emits light in a red wavelength range. Subpixel SP2 comprises a display element 20 which emits light in a green wavelength range. Subpixel SP3 comprises a display element 20 which emits light in a blue wavelength range.

Figure 2:
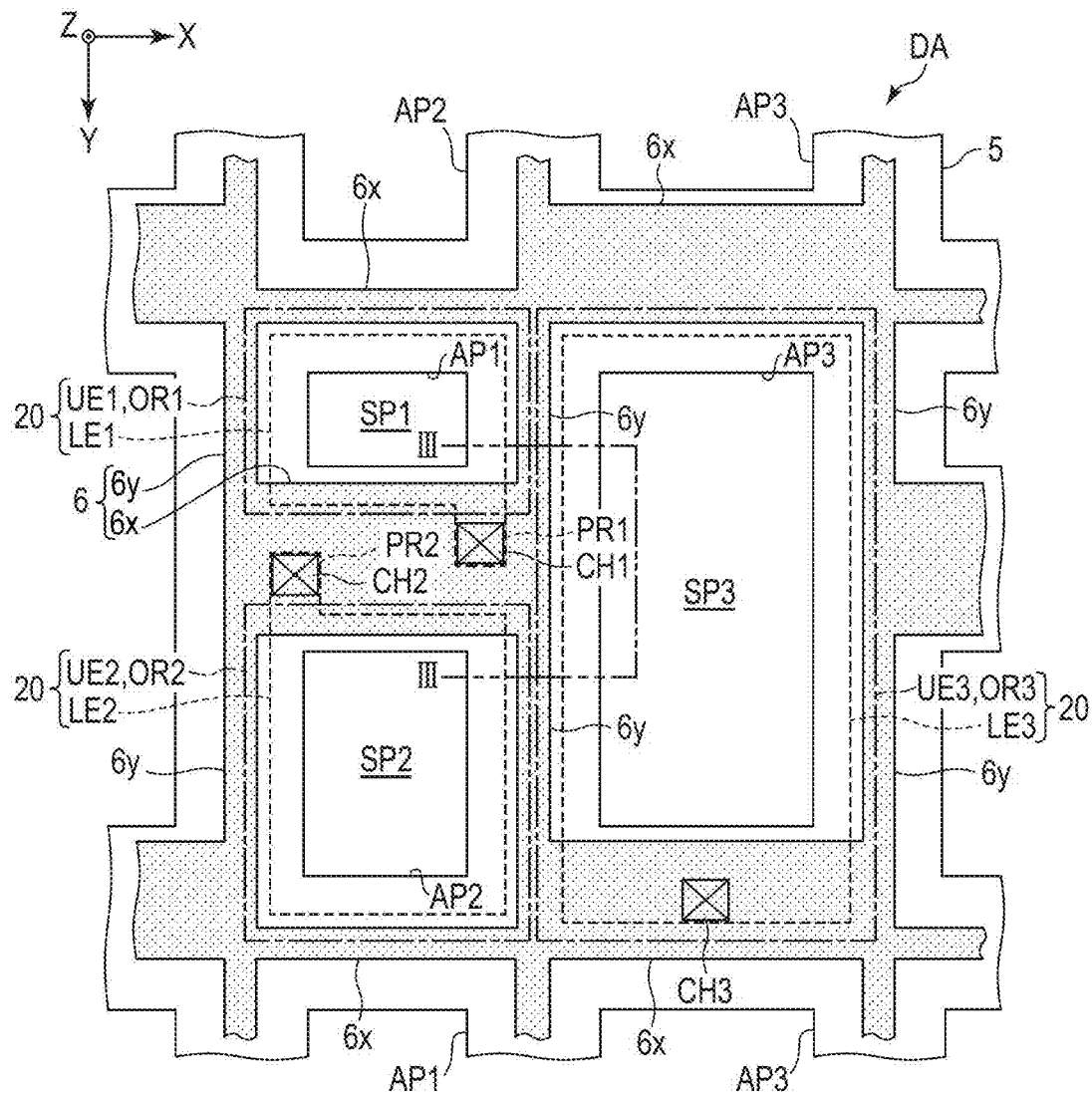
FIG. 2 is a diagram showing an example of the layout of subpixels.

FIG. 2 is a diagram showing an example of the layout of subpixels SP1, SP2 and SP3. In the example of FIG. 2, subpixels SP1 and SP2 are arranged in the second direction Y. Further, each of subpixels SP1 and SP2 is adjacent to subpixel SP3 in the first direction X.

When subpixels SP1, SP2 and SP3 are provided in line with this layout, in the display area DA, a column in which subpixels SP1 and SP2 are alternately provided in the second direction Y and a column in which a plurality of subpixels SP3 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively. In the example of FIG. 2, the aperture AP2 is larger than the aperture AP1, and the aperture AP3 is larger than the aperture AP2.

The partition 6 is provided in the boundary between adjacent subpixels SP and overlaps the rib 5 as seen in plan view. The partition 6 comprises a plurality of first partitions 6x extending in the first direction X and a plurality of second partitions 6y extending in the second direction Y. The first partitions 6x are provided between the apertures AP1 and AP2 which are adjacent to each other in the second direction Y and between two apertures AP3 which are adjacent to each other in the second direction Y. Each second partition 6y is provided between the apertures AP1 and AP3 which are adjacent to each other in the first direction X and between the apertures AP2 and AP3 which are adjacent to each other in the first direction X.

In the example of FIG. 2, the first partitions 6x and the second partitions 6y are connected to each other. In this configuration, the partition 6 has a grating shape surrounding the apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3. In the example of FIG. 2, the outer shapes of the upper electrode UE1 and the organic layer OR1 are coincident with each other. The outer shapes of the upper electrode UE2 and the organic layer OR2 are coincident with each other. The outer shapes of the upper electrode UE3 and the organic layer OR3 are coincident with each other.

The lower electrode LE1, the upper electrode UE1 and the organic layer OR1 constitute the display element 20 of subpixel SP1. The lower electrode LE2, the upper electrode UE2 and the organic layer OR2 constitute the display element 20 of subpixel SP2. The lower electrode LE3, the upper electrode UE3 and the organic layer OR3 constitute the display element 20 of subpixel SP3.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the contact holes CH1 and CH2 entirely overlap the first partition 6X between the apertures AP1 and AP2 which are adjacent to each other in the second direction Y. The contact hole CH3 entirely overlaps the first partition 6x between two apertures AP3 which are adjacent to each other in the second direction Y. As another example, at least part of the contact hole CH1, CH2 or CH3 may not overlap the first partition 6x.

In the example of FIG. 2, the lower electrodes LE1 and LE2 comprise protrusions PR1 and PR2, respectively. The protrusion PR1 protrudes from the body of the lower electrode LE1 (the portion overlapping the aperture AP1) toward the contact hole CH1. The protrusion PR2 protrudes from the body of the lower electrode LE2 (the portion overlapping the aperture AP2) toward the contact hole CH2. The contact holes CH1 and CH2 overlap the protrusions PR1 and PR2, respectively.

Figure 3:
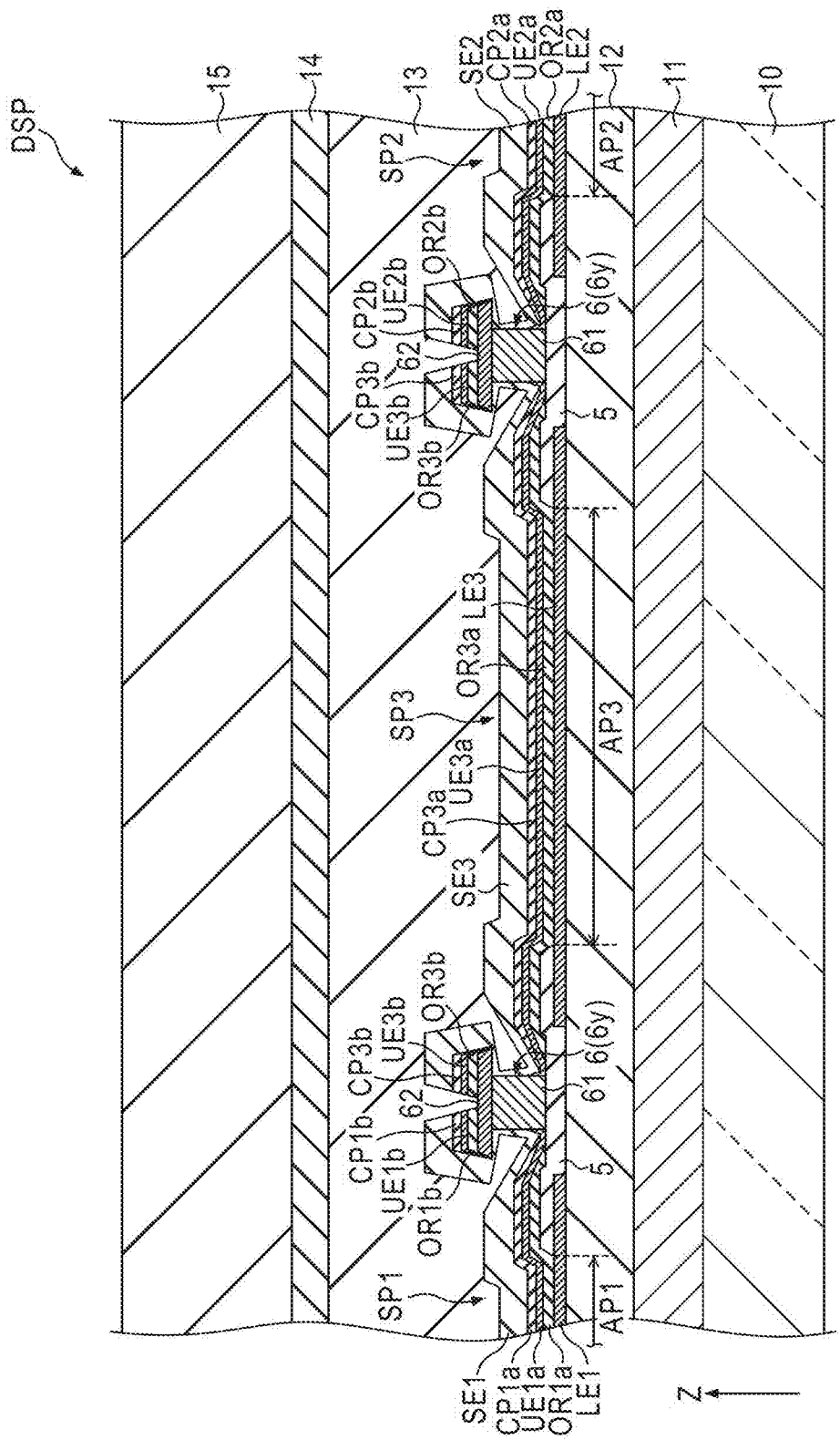
FIG. 3 is a schematic cross-sectional view of the display device along the III-III line of FIG. 2.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1. The circuit layer 11 is covered with an insulating layer 12. The insulating layer 12 functions as a planarization film which planarizes the irregularities formed by the circuit layer 11. Although not shown in the section of FIG. 3, the contact holes CH1, CH2 and CH3 described above are provided in the insulating layer 12.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5.

The partition 6 includes a lower portion 61 provided on the rib 5 and an upper portion 62 which covers the upper surface of the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 may be called an overhang shape.

The organic layer OR1 shown in FIG. 2 includes first and second organic layers OR1a and OR1b spaced apart from each other. The upper electrode UE1 shown in FIG. 2 includes first and second upper electrodes UE1a and UE1b spaced apart from each other. As shown in FIG. 3, the first organic layer OR1a is in contact with the lower electrode LE1 through the aperture AP1 and covers part of the rib 5. The second organic layer OR1b is located on the upper portion 62. The first upper electrode UE1a faces the lower electrode LE1 and covers the first organic layer OR1a. Further, the first upper electrode UE1a is in contact with a side surface of the lower portion 61. The second upper electrode UE1b is located above the partition 6 and covers the second organic layer OR1b.

The organic layer OR2 shown in FIG. 2 includes first and second organic layers OR2a and OR2b spaced apart from each other. The upper electrode UE2 shown in FIG. 2 includes first and second upper electrodes UE2a and UE2b spaced apart from each other. As shown in FIG. 3, the first organic layer OR2a is in contact with the lower electrode LE2 through the aperture AP2 and covers part of the rib 5. The second organic layer OR2b is located on the upper portion 62. The first upper electrode UE2a faces the lower electrode LE2 and covers the first organic layer OR2a. Further, the first upper electrode UE2a is in contact with a side surface of the lower portion 61. The second upper electrode UE2b is located above the partition 6 and covers the second organic layer OR2b.

The organic layer OR3 shown in FIG. 2 includes first and second organic layers OR3a and OR3b spaced apart from each other. The upper electrode UE3 shown in FIG. 2 includes first and second upper electrodes UE3a and UE3b spaced apart from each other. As shown in FIG. 3, the first organic layer OR3a is in contact with the lower electrode LE3 through the aperture AP3 and covers part of the rib 5. The second organic layer OR3b is located on the upper portion 62. The first upper electrode UE3a faces the lower electrode LE3 and covers the first organic layer OR3a. Further, the first upper electrode UE3a is in contact with a side surface of the lower portion 61. The second upper electrode UE3b is located above the partition 6 and covers the second organic layer OR3b.

In the example of FIG. 3, subpixels SP1, SP2 and SP3 include cap layers CP1, CP2 and CP3 for adjusting the optical property of the light emitted from the respective light emitting layers of the organic layers OR1, OR2 and OR3.

The cap layer CP1 includes first and second cap layers CP1a and CP1b spaced apart from each other. The first cap layer CP1a is located in the aperture AP1 and is provided on the first upper electrode UE1a. The second cap layer CP1b is located above the partition 6 and is provided on the second upper electrode UE1b.

The cap layer CP2 includes first and second cap layers CP2a and CP2b spaced apart from each other. The first cap layer CP2a is located in the aperture AP2 and is provided on the first upper electrode UE2a. The second cap layer CP2b is located above the partition 6 and is provided on the second upper electrode UE2b.

The cap layer CP3 includes first and second cap layers CP3a and CP3b spaced apart from each other. The first cap layer CP3a is located in the aperture AP3 and is provided on the first upper electrode UE3a. The second cap layer CP3b is located above the partition 6 and is provided on the second upper electrode UE3b.

Sealing layers SE1, SE2 and SE3 are provided in subpixels SP1, SP2 and SP3, respectively. The sealing layer SE1 continuously covers the members of subpixel SP1 including the first cap layer CP1a, the partition 6 and the second cap layer CP1b. The sealing layer SE2 continuously covers the members of subpixel SP2 including the first cap layer CP2a, the partition 6 and the second cap layer CP2b. The sealing layer SE3 continuously covers the members of subpixel SP3 including the first cap layer CP3a, the partition 6 and the second cap layer CP3b.

In the example of FIG. 3, the second organic layer OR1b, the second upper electrode UE1b, the second cap layer CP1b and the sealing layer SE1 on the partition 6 between subpixels SP1 and SP3 are spaced apart from the second organic layer OR3b, the second upper electrode UE3b, the second cap layer CP3b and the sealing layer SE3 on this partition 6. The second organic layer OR2b, the second upper electrode UE2b, the second cap layer CP2b and the sealing layer SE2 on the partition 6 between subpixels SP2 and SP3 are spaced apart from the second organic layer OR3b, the second upper electrode UE3b, the second cap layer CP3b and the sealing layer SE3 on this partition 6.

The sealing layers SE1, SE2 and SE3 are covered with a resinous layer 13. The resinous layer 13 is covered with a sealing layer 14. Further, the sealing layer 14 is covered with a resinous layer 15.

The insulating layer 12 and the resinous layers 13 and 15 are formed of an organic material. The rib 5 and the sealing layers 14, SE1, SE2 and SE3 are formed of, for example, an inorganic material such as silicon nitride (SiNx).

The lower portion 61 of the partition 6 is conductive. The upper portion 62 of the partition 6 may be also conductive. The lower electrodes LE1, LE2 and LE3 may be formed of a transparent conductive oxide such as indium tin oxide (ITO) or may comprise a multilayer structure of a metal material such as silver (Ag) and a conductive oxide. The upper electrodes UE1, UE2 and UE3 are formed of, for example, a metal material such as an alloy of magnesium and silver (MgAg). The upper electrodes UE1, UE2 and UE3 may be formed of a conductive oxide such as ITO.

When the potential of the lower electrodes LE1, LE2 and LE3 is relatively higher than that of the upper electrodes UE1, UE2 and UE3, the lower electrodes LE1, LE2 and LE3 are equivalent to anodes, and the upper electrodes UE1, UE2 and UE3 are equivalent to cathodes. When the potential of the upper electrodes UE1, UE2 and UE3 is relatively higher than that of the lower electrodes LE1, LE2 and LE3, the upper electrodes UE1, UE2 and UE3 are equivalent to anodes, and the lower electrodes LE1, LE2 and LE3 are equivalent to cathodes.

The organic layers OR1, OR2 and OR3 include a pair of function layers and a light emitting layer provided between these function layers. For example, the organic layers OR1, OR2 and OR3 comprise a structure in which a hole injection layer, a hole transport layer, an electron blocking layer, a light emitting layer, a hole blocking layer, an electron transport layer and an electron injection layer are stacked in order.

The cap layers CP1, CP2 and CP3 are formed of, for example, a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

Common voltage is applied to the partition 6. This common voltage is applied to each of the first upper electrodes UE1$a$, UE2$a$ and UE3$a$ which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer of the first organic layer OR1$a$ emits light in a red wavelength range. When a potential difference is formed between the lower electrode LE2 and the upper electrode UE2, the light emitting layer of the first organic layer OR2$a$ emits light in a green wavelength range. When a potential difference is formed between the lower electrode LE3 and the upper electrode UE3, the light emitting layer of the first organic layer OR3$a$ emits light in a blue wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including a quantum dot which generates light exhibiting colors corresponding to subpixels SP1, SP2 and SP3 by the excitation caused by the light emitted from the light emitting layers.

Figure 4:
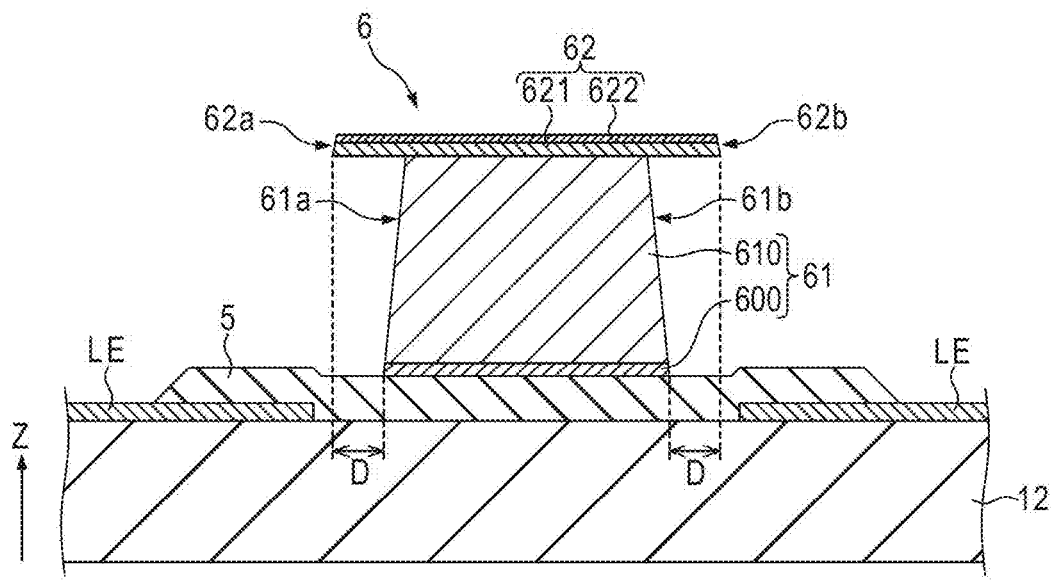
FIG. 4 is a schematic cross-sectional view of a partition.

FIG. 4 is a schematic enlarged cross-sectional view of the partition 6. In this figure, the elements other than the rib 5, the partition 6, the insulating layer 12 and a pair of lower electrodes LE are omitted. The pair of lower electrodes LE is equivalent to one of the lower electrodes LE1, LE2 and LE3 described above. The first and second partitions 6$x$ and 6$y$ described above comprise the same structure as the partition 6 shown in FIG. 4.

In the example of FIG. 4, the lower portion 61 of the partition 6 includes a barrier layer 600 provided on the rib 5, and a metal layer 610 provided on the barrier layer 600. The metal layer 610 is formed so as to be thicker than the barrier layer 600. The metal layer 610 may comprise either a single-layer structure or a multilayer structure of different metal materials.

The upper portion 62 is thinner than the lower portion 61. In the example of FIG. 4, the upper portion 62 includes a first layer 621 provided on the metal layer 610, and a second layer 622 which covers the first layer 621.

In the example of FIG. 4, the width of the lower portion 61 decreases toward the upper portion 62. In other words, the side surfaces 61$a$ and 61$b$ of the lower portion 61 incline with respect to the third direction Z. The upper portion 62 comprises an end portion 62$a$ protruding from the side surface 61$a$ and an end portion 62$b$ protruding from the side surface 61$b$.

The amount D of protrusion of each of the end portions 62$a$ and 62$b$ from the side surfaces 61$a$ and 61$b$ is, for example, less than or equal to 2.0 μm. Here, the amount D of protrusion is equivalent to the distance from the lower ends of the side surfaces 61$a$ and 61$b$ (barrier layer 600) to the end portions 62$a$ and 62$b$ in the width direction of the partition 6 (the first direction X or the second direction Y).

Figure 5:
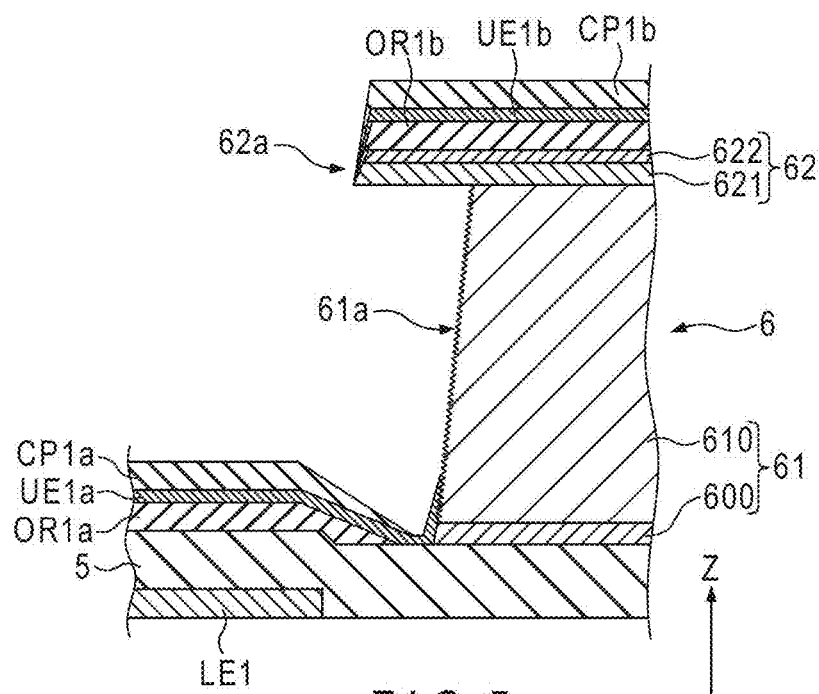
FIG. 5 is an example of a schematic cross-sectional view in which part of the partition is enlarged.

FIG. 5 is an example of a schematic cross-sectional view in which part of the partition 6 is enlarged. This figure shows the rib 5, the lower electrode LE1, the first organic layer OR1$a$, the first upper electrode UE1$a$, the first cap layer CP1$a$, the second organic layer OR1$b$, the second upper electrode UE1$b$ and the second cap layer CP1$b$ in addition to the partition 6.

As shown in FIG. 5, the side surface 61$a$ of the lower portion 61 comprises fine projections and depressions. Alternatively, the side surface 61$a$ has roughness. For example, these projections and depressions are formed on the surface of the metal layer 610 in the side surface 61$a$. In another respect, the roughness of at least part of the side surface 61$a$ is greater than that of, of the metal layer 610, the upper surface which is in contact with the first layer 621, of the metal layer 610, the lower surface which is in contact with the barrier layer 600, of the barrier layer 600, the upper surface which is in contact with the lower surface of the metal layer 610, the upper surface of the rib 5, etc.

The first upper electrode UE1$a$ is in contact with, of the side surface 61$a$, an area including projections and depressions. By this configuration, the contact area between the first upper electrode UE1$a$ and the lower portion 61 is increased, and thus, the conduction between the lower portion 61 and the first upper electrode UE1$a$ can be satisfactorily ensured.

FIG. 5 focuses attention on the side surface 61$a$. It should be noted that the side surface 61$b$ comprises similar projections and depressions. Further, these projections and depressions satisfactorily ensure the conduction between the first upper electrodes UE2$a$ and UE3$a$ and the lower portion 61. In the above example of FIG. 5, the side surface 61$a$ comprises fine projections and depressions. However, the configuration is not limited to this example. The side surfaces 61$a$ and 61$b$ of the lower portion 61 may be smooth surfaces or flat surfaces. Even in this case, it is possible to ensure satisfactory conduction as long as the first upper electrode UE1$a$ is formed by the manufacturing method described later.

Now, this specification explains the manufacturing method of the display device DSP.

Figure 6:
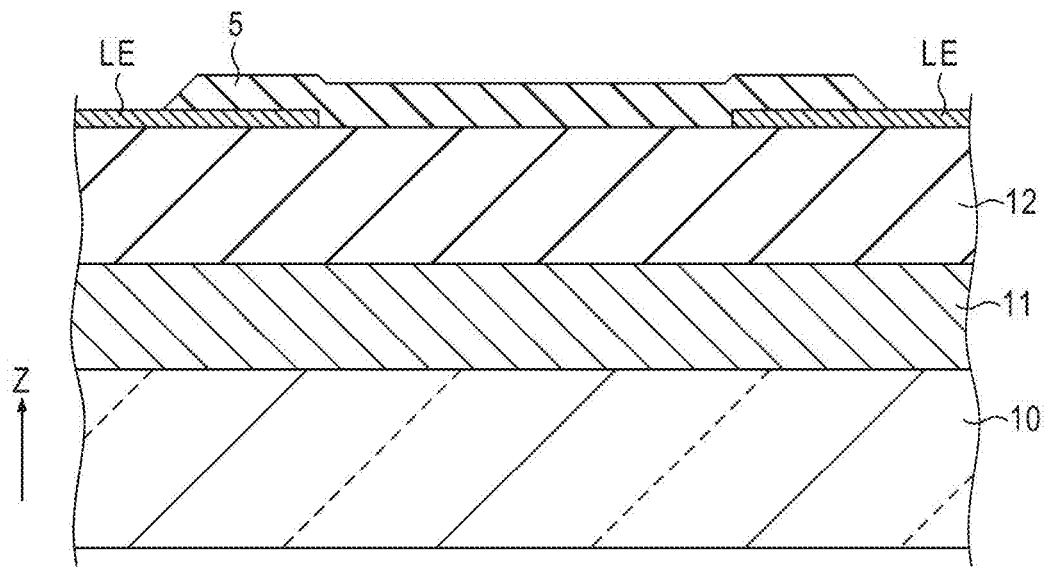
FIG. 6 is a schematic cross-sectional view showing a manufacturing process for forming the partition.

FIG. 6 to FIG. 10 are schematic cross-sectional views mainly showing a process for forming the partition 6 in the manufacturing method of the display device DSP. First, as shown in FIG. 6, the circuit layer 11, the insulating layer 12, the lower electrodes LE and the rib 5 are formed in order above the substrate 10.

Figure 7:
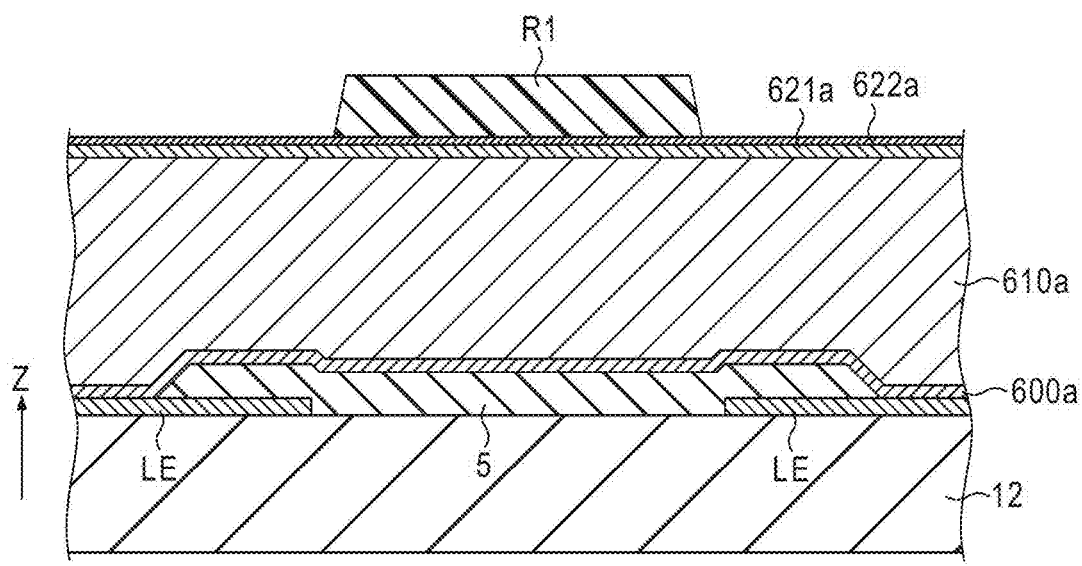
FIG. 7 is a schematic cross-sectional view showing a manufacturing process following FIG. 6.

Subsequently, as shown in FIG. 7, a barrier layer 600$a$ which covers the rib 5 and the lower electrodes LE is formed. A metal layer 610$a$ is formed on the barrier layer 600$a$. A first layer 621$a$ is formed on the metal layer 610$a$. A second layer 622$a$ is formed on the first layer 621$a$. To form the barrier layer 600$a$, the metal layer 610$a$, the first layer 621$a$ and the second layer 622$a$, sputtering can be used.

Further, as shown in FIG. 7, a resist R1 is formed on the second layer 622a. The resist R1 has been patterned into the same shape as the partition 6 as seen in plan view.

Figure 8:
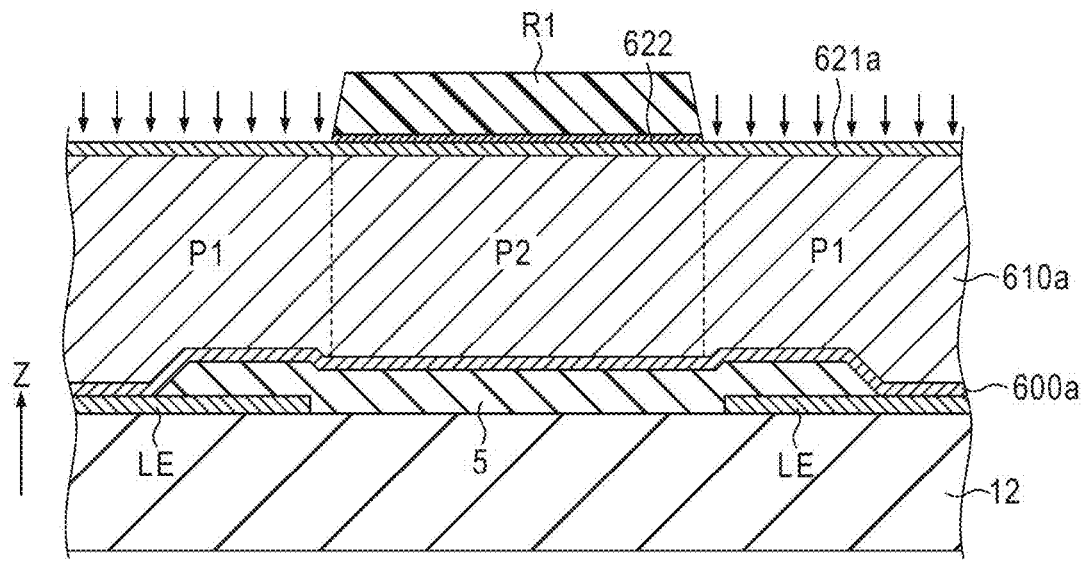
FIG. 8 is a schematic cross-sectional view showing a manufacturing process following FIG. 7.

Subsequently, as shown in FIG. 8, etching is performed by using the resist R1 as a mask. Of the second layer 622a, the portion exposed from the resist R1 is removed. In this way, the second layer 622 having the shape shown in FIG. 4 is formed. In the following explanation, of the metal layer 610a, the portion exposed from the resist R1 and the second layer 622 (in other words, the portion which does not overlap the resist R1 or the second layer 622 in the third direction Z) is called a first portion P1. Of the metal layer 610a, the portion located under the resist R1 and the second layer 622 is called a second portion P2.

In the present embodiment, two types of etching are applied to the metal layer 610a, thereby forming the metal layer 610 having the shape shown in FIG. 4. Specifically, the anisotropic dry etching shown in FIG. 9 and the isotropic wet etching shown in FIG. 10 are performed.

Figure 9:
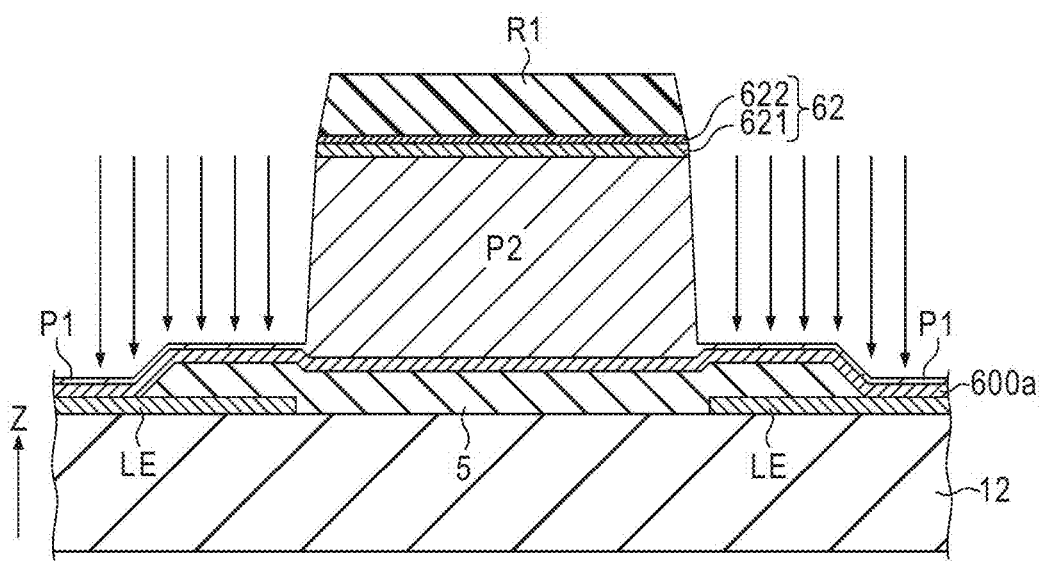
FIG. 9 is a schematic cross-sectional view showing a manufacturing process following FIG. 8.

As shown in FIG. 9, in the anisotropic dry etching, of the first layer 621a, the portion exposed from the resist R1 and the second layer 622 is removed. By this process, the upper portion 62 including the first layer 621 and the second layer 622 having the shape shown in FIG. 4 is formed.

Further, in the anisotropic dry etching, the thickness of the first portion P1 is reduced. The first portion P1 may be completely removed. However, in this case, the chamber of the etching device may become dirty because of the barrier layer 600a. Thus, the anisotropic dry etching should be preferably stopped in a state where the first portion P1 is partly left. In the anisotropic dry etching, the second portion P2 located under the resist R1 is not substantially cut.

Figure 10:
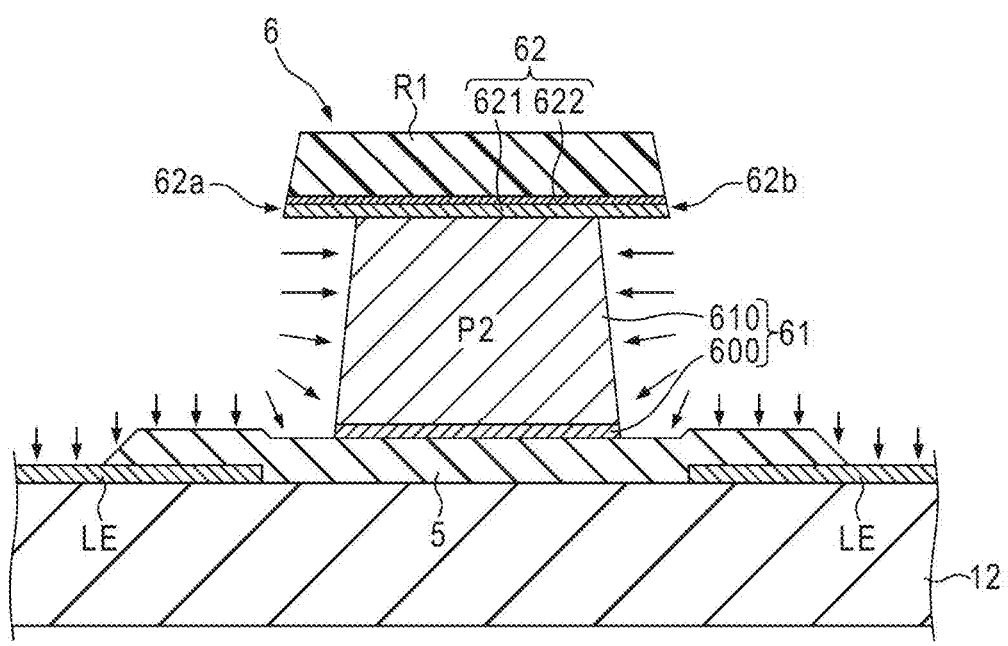
FIG. 10 is a schematic cross-sectional view showing a manufacturing process following FIG. 9.

In the isotropic wet etching, as shown in FIG. 10, of the first portion P1, the part remaining in the anisotropic dry etching and the barrier layer 600a located under this part are removed. Further, by removing the portions located under the end portions 62a and 62b of the upper portion 62 from the second portion P2, the width of the second portion P2 is reduced. By this process, the lower portion 61 including the barrier layer 600 and the metal layer 610 having the shape shown in FIG. 4 is formed. The projections and depressions of the side surface 61a shown in FIG. 5 are formed in, for example, isotropic wet etching.

The amount of the reduction in the width of the second portion P2 by isotropic wet etching could be changed based on the shape required for the partition 6. For example, in isotropic wet etching, the width of the second portion P2 is reduced such that the amount D of protrusion described above is less than or equal to 2.0 µm.

After the partition 6 is completed by the process of FIG. 6 to FIG. 10, the resist R1 is removed. Further, a process for forming the display element 20 is applied to subpixels SP1, SP2 and SP3.

Figure 11:
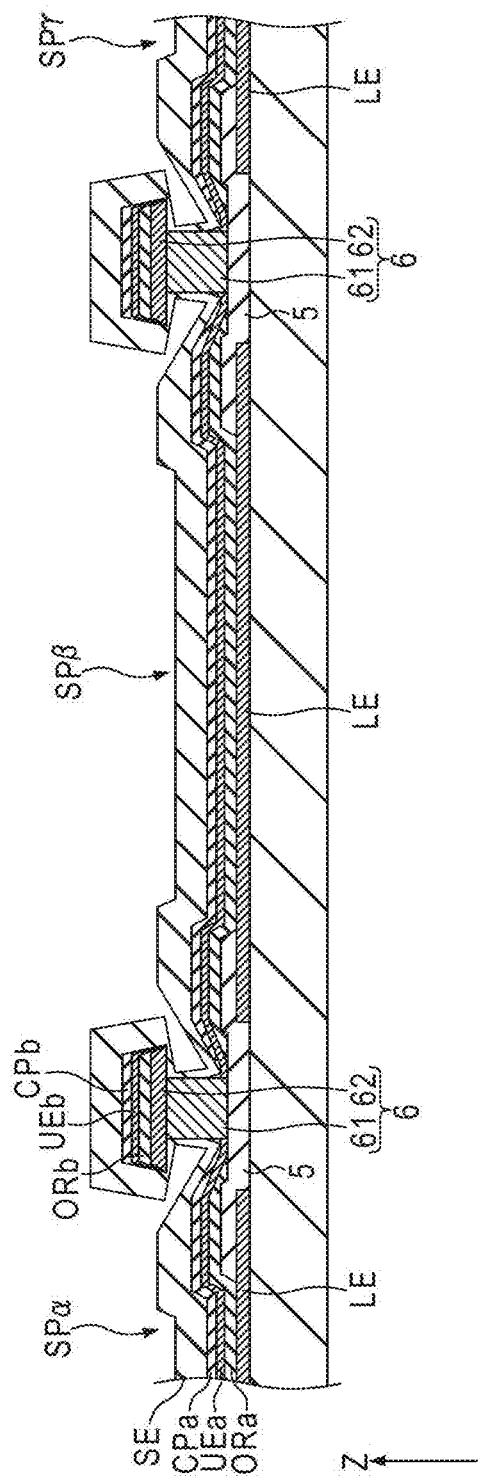
FIG. 11 is a schematic cross-sectional view showing a manufacturing process for forming a display element.
Figure 12:
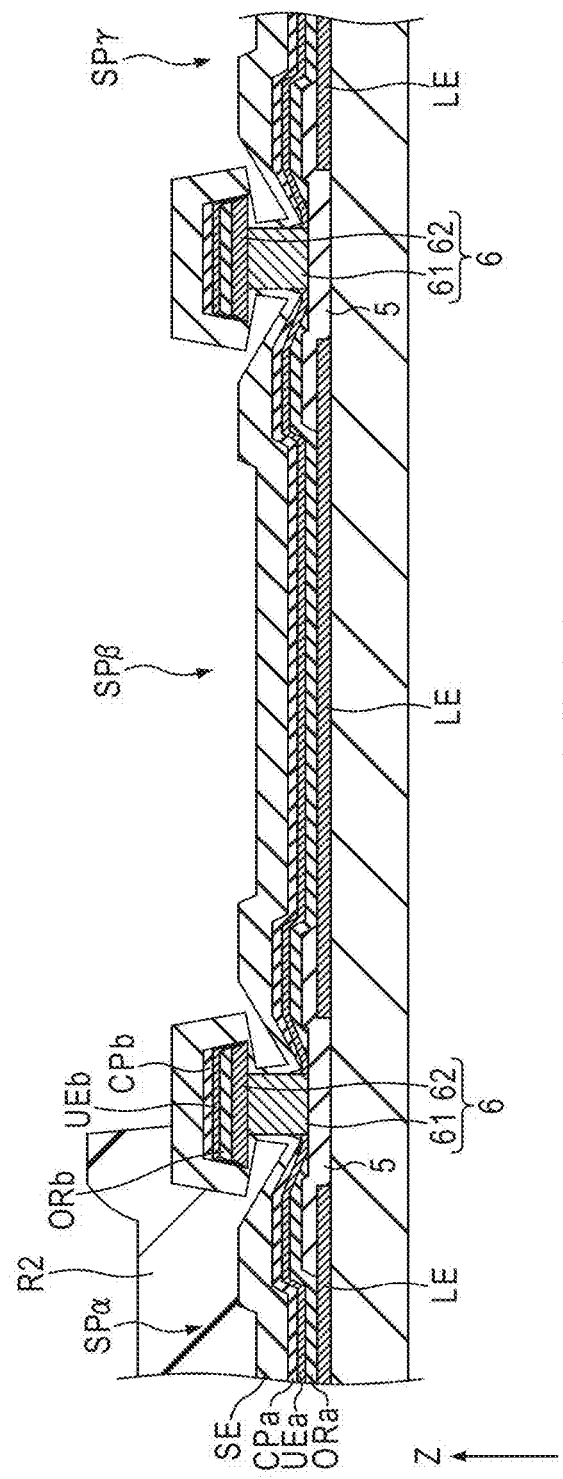
FIG. 12 is a schematic cross-sectional view showing a manufacturing process following FIG. 11.
Figure 13:
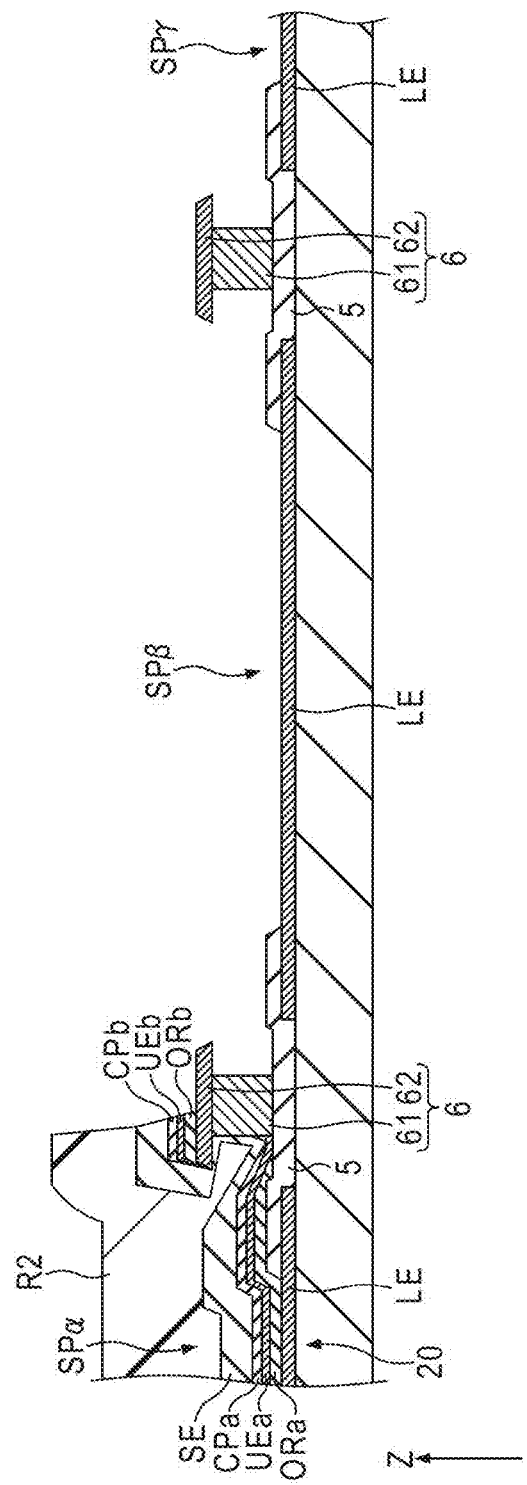
FIG. 13 is a schematic cross-sectional view showing a manufacturing process following FIG. 12.

FIG. 11 to FIG. 13 are schematic cross-sectional views mainly showing a process for forming the display element 20 in the manufacturing method of the display device DSP. Each of the subpixels SPα, SPβ, and SPγ shown in these figures is equivalent to one of subpixels SP1, SP2 and SP3.

After the partition 6 is formed as described above, an organic layer OR, an upper electrode UE, a cap layer CP and a sealing layer SE are formed in order in the entire substrate by vapor deposition as shown in FIG. 11. The organic layer OR includes a light emitting layer which emits light exhibiting a color corresponding to subpixel SPα. The partition 6 having an overhang shape divides the organic layer OR into a first organic layer ORa which covers the lower electrode LE and a second organic layer ORb on the partition 6, and divides the upper electrode UE into a first upper electrode UEa which covers the first organic layer ORa and a second upper electrode UEb which covers the second organic layer ORb, and divides the cap layer CP into a first cap layer CPa which covers the first upper electrode UEa and a second cap layer CPb which covers the second upper electrode UEb. The first upper electrode UEa is in contact with the lower portion 61 of the partition 6. The sealing layer SE continuously covers the first cap layer CPa, the second cap layer CPb and the partition 6.

Subsequently, as shown in FIG. 12, a resist R2 is formed on the sealing layer SE. The resist R2 covers subpixel SPα. In other words, the resist R2 is provided immediately above the first organic layer ORa, the first upper electrode UEa and the first cap layer CPa located in subpixel SPα. The resist R2 is also located immediately above, of the second organic layer ORb, the second upper electrode UEb and the second cap layer CPb on the partition 6 between subpixels SPα and SPβ, the portion close to subpixel SPα. In other words, at least part of the partition 6 is exposed from the resist R2.

Further, the portion exposed from the resist R2 is removed from the organic layer OR, the upper electrode UE, the cap layer CP and the sealing layer SE as shown in FIG. 13 by etching using the resist R2 as a mask. In this way, the display element 20 including the lower electrode LE, the first organic layer ORa, the first upper electrode UEa and the first cap layer CPa is formed in subpixel SPα. In subpixels SPβ and SPγ, the lower electrode LE is exposed. This etching is, for example, dry etching using an etching gas such as CF4 or CF6.

Subsequently, the resist R2 is removed, and the processes for forming the display elements 20 of subpixels SPβ and SPγ are performed in series. These processes are similar to the process described above regarding subpixel SPα.

By the process exemplarily shown above regarding subpixels SPα, SPβ and SPγ, the display elements 20 of subpixels SP1, SP2 and SP3 are formed. Further, by forming the resinous layer 13, the sealing layer 14 and the resinous layer 15, the display device DSP shown in FIG. 3 is completed.

The structure or manufacturing process of the partition 6 is not limited to the example shown in FIG. 4 to FIG. 10.

Figure 14:
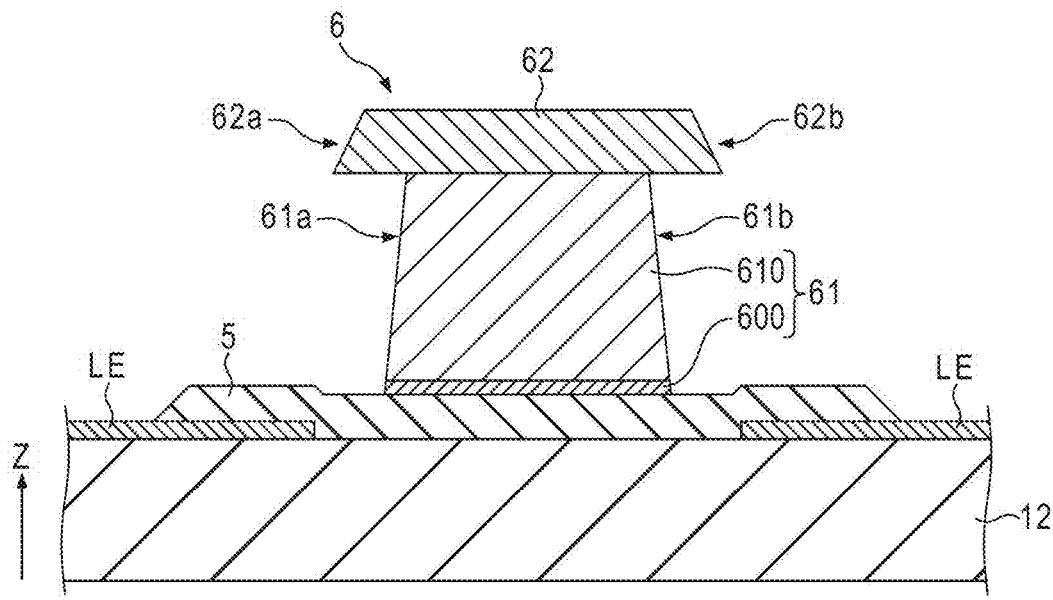
FIG. 14 is a schematic cross-sectional view showing another example of a structure which could be applied to the partition.

FIG. 14 is a schematic cross-sectional view showing another example of a structure which could be applied to the partition 6. In the partition 6 shown in this figure, the upper portion 62 comprises a single-layer structure. Compared to the example shown in FIG. 4, the upper portion 62 is thick. Further, the width of the upper portion 62 decreases toward the upper side. In other words, the side surfaces of the upper portion 62 in the end portions 62a and 62b have a taper shape in which the side surfaces incline with respect to the third direction Z.

Figure 15:
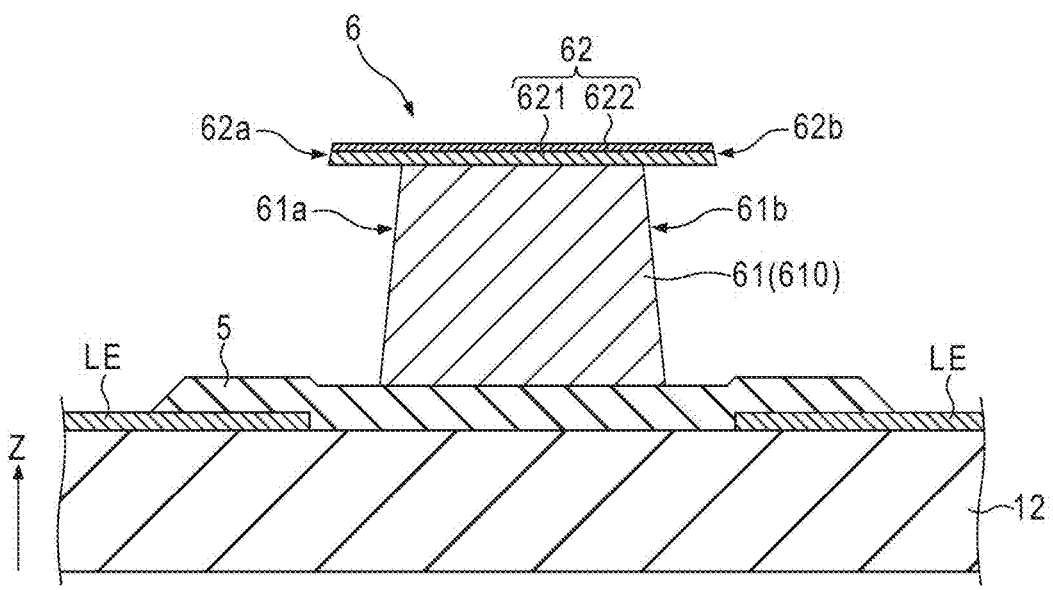
FIG. 15 is a schematic cross-sectional view showing yet another example of a structure which could be applied to the partition.

FIG. 15 is a schematic cross-sectional view showing yet another example of a structure which could be applied to the partition 6. The partition 6 shown in this figure does not comprise the barrier layer 600. In other words, the metal layer 610 is in contact with the rib 5.

Figures 16, 17:
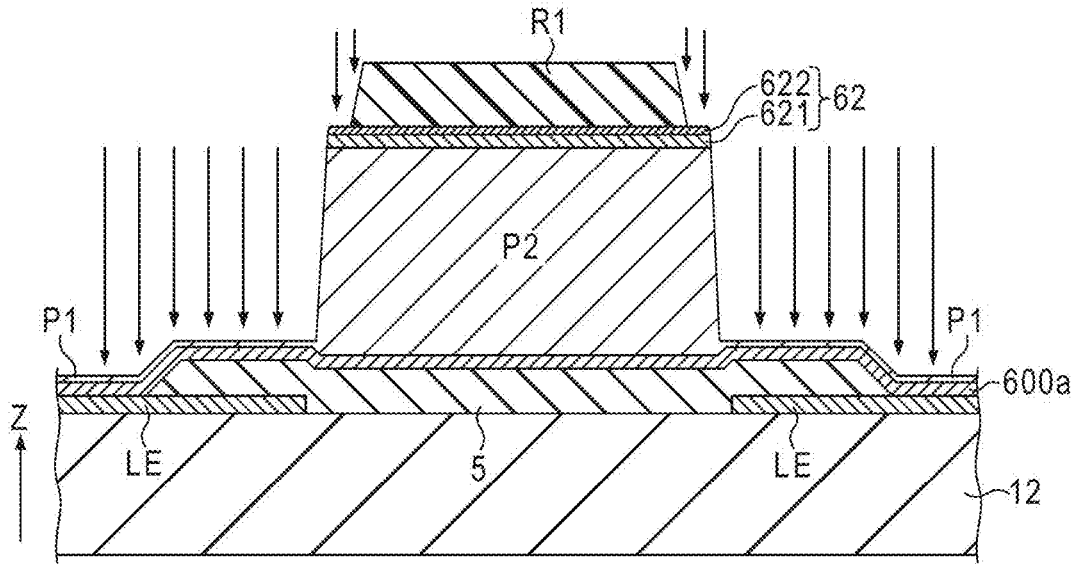
FIG. 16 is a schematic cross-sectional view showing another example of the manufacturing process of the partition.
FIG. 17 is a chart showing practical examples 1 to 4.

FIG. 16 is a schematic cross-sectional view showing another example of the manufacturing process of the partition 6. This process is equivalent to the anisotropic dry etching shown in FIG. 9. There is a possibility that the width of the resist R1 is reduced during etching as shown in FIG. 16 depending on the conditions of the etching. Even in this case, for example, when the second layer 622 is formed of a material in which the resistance to anisotropic dry etching is high, the damage to the upper portion 62 can be prevented.

In the display device DSP and the manufacturing method thereof described above, to enhance the reliability of the display device DSP, it is necessary to form the display element 20 after forming the partition 6 having a good overhang shape. In other words, if the shape is defective in at least part of the partition 6, for example, if the amount D of protrusion of the upper portion 62 is small, some portions are not divided by the partition 6 in the organic layer OR1, OR2 or OR3 or the upper electrode UE1, UE2 or UE3. Thus, the structure shown in FIG. 3 cannot be obtained.

Even if the partition 6 is satisfactorily formed through the process shown in FIG. 6 to FIG. 10, the partition 6 may be lost or deformed in the subsequent process. For example, as at least part of the partition 6 is exposed in the etching process shown in FIG. 13, when the partition 6 is formed of a material in which the resistance to the etching is low, the partition 6 may be damaged. Therefore, at least the upper portion 62 should be preferably formed of a material in which the etching selectivity is high compared to the sealing layer SE, etc., in the etching.

To obtain a shape in which the lower portion 61 is satisfactorily bound up, the metal layer 610 should be preferably formed of a material which can be easily cut in the isotropic wet etching shown in FIG. 10.

The structure of the partition 6 and the materials of the elements of the partition 6 are selected in consideration of these various reasons. Now, this specification discloses practical examples related to the structure of the partition 6 and the materials of the elements.

FIG. 17 is a chart showing practical examples 1 to 4. The partition 6 of each of practical examples 1 to 3 comprises the barrier layer 600, the metal layer 610, the first layer 621 and the second layer 622. The partition 6 of practical example 4 comprises the metal layer 610, the first layer 621 and the second layer 622 and does not comprise the barrier layer 600.

In each of practical examples 1 to 4, the metal layer 610 is formed of aluminum (Al), and the first layer 621 is formed of titanium (Ti), and the second layer 622 is formed of ITO. In practical example 1, the barrier layer 600 is molybdenum (Mo). In practical example 2, the barrier layer 600 is formed of molybdenum tungsten alloy (MoW). In practical example 3, the barrier layer 600 is formed of copper (Cu). The metal layer 610 may be formed of aluminum alloy.

Thus, when the upper portion 62 comprises a multilayer structure of titanium and ITO, the thickness of the entire upper portion 62 should be preferably, for example, 50 to 300 nm. The thickness of the entire lower portion 61 should be preferably, for example, 400 to 1500 nm.

In each of practical examples 1 to 4, the thickness of the first layer 621 is 100 nm, and the thickness of the second layer 622 is 50 nm. Thus, the second layer 622 is thinner than the first layer 621. The thickness of the metal layer 610 is 950 nm in practical examples 1 and 3, and is 800 nm in practical example 2, and is 1000 nm in practical example 4. The thickness of the barrier layer 600 is 50 nm in practical examples 1 and 3, and is 200 nm in practical example 2.

In each of practical examples 1 to 4, the second layer 622 may be formed of a conductive oxide other than ITO. As this conductive oxide, for example, indium zinc oxide (IZO) or indium gallium zinc oxide (IGZO) may be used.

FIG. 18 is a chart showing practical examples 5 to 8. The partition 6 of each of practical examples 5 to 8 comprises the metal layer 610 formed of aluminum, and the upper portion 62 comprising a single-layer structure of titanium. The metal layer 610 may be formed of aluminum alloy. The partition 6 of each of practical examples 5 to 7 comprises the barrier layer 600. The partition 6 of practical example 8 does not comprise the barrier layer 600. In practical example 5, the barrier layer 600 is formed of molybdenum. In practical example 6, the barrier layer 600 is formed of molybdenum tungsten alloy. In practical example 7, the barrier layer 600 is formed of copper.

Thus, when the upper portion 62 comprises a single-layer structure of titanium, the thickness of the upper portion 62 should be preferably, for example, 100 to 500 nm. The thickness of the entire lower portion 61 should be preferably, for example, 400 to 1500 nm.

In each of practical examples 5 to 8, the thickness of the upper portion 62 is 200 nm. The thickness of the metal layer 610 is 950 nm in practical examples 5 and 7, and is 800 nm in practical example 6, and is 1000 nm in practical example 8. The thickness of the barrier layer 600 is 50 nm in practical examples 5 and 7, and is 200 nm in practical example 6.

FIG. 19 is a chart showing practical examples 9 to 12. The partition 6 of each of practical examples 9 to 12 comprises the metal layer 610 formed of aluminum, the first layer 621 formed of titanium, and the second layer 622 formed of silicon oxide (SiO). The metal layer 610 may be formed of aluminum alloy. The partition 6 of each of practical examples 9 to 11 comprises the barrier layer 600. The partition 6 of practical example 12 does not comprise the barrier layer 600. In practical example 9, the barrier layer 600 is formed of molybdenum. In practical example 10, the barrier layer 600 is formed of molybdenum tungsten alloy. In practical example 11, the barrier layer 600 is formed of copper.

Thus, when the upper portion 62 comprises a multilayer structure of titanium and silicon oxide, the thickness of the entire upper portion 62 should be preferably, for example, 100 to 500 nm. The thickness of the entire lower portion 61 should be preferably, for example, 400 to 1500 nm.

In each of practical examples 9 to 12, the thickness of the first layer 621 is 50 nm, and the thickness of the second layer 622 is 250 nm. Thus, the second layer 622 is thicker than the first layer 621. The thickness of the metal layer 610 is 950 nm in practical examples 9 and 11, and is 800 nm in practical example 10, and is 1000 nm in practical example 12. The thickness of the barrier layer 600 is 50 nm in practical examples 9 and 11, and is 200 nm in practical example 10.

In the conductive oxide, titanium or silicon oxide forming the upper portion 62 in the above practical examples 1 to 12, the etching speed in the etching shown in FIG. 13 is less than that of the sealing layer SE formed of silicon nitride. Thus, by forming the upper portion 62 with these materials, the damage to the partition 6 in the etching can be prevented.

In particular, a conductive oxide such as ITO, IZO and IGZO has a high resistance to dry etching using an etching gas such as CF4 and CF6. Thus, when these conductive oxides are used for the second layer 622 which is the surface layer of the upper portion 62, the damage to the upper portion 62 can be effectively prevented.

If the upper portion 62 is thick, when the upper layer OR (OR1, OR2 and OR3), the upper electrode UE (UE1, UE2 and UE3) and the cap layer CP (CP1, CP2 and CP3) are formed by vapor deposition, the range of the shadow from the evaporation source is increased by the upper portion 62. In this case, the organic layer OR, the upper electrode UE or the cap layer CP having a sufficient thickness cannot be formed near the partition 6. To the contrary, when a conductive oxide is used for the second layer 622, the damage in etching is prevented as described above. Thus, the upper portion 62 can be made thin. In this way, the range of the shadow from the evaporation source can be decreased.

For example, when the upper portion 62 is relatively thick like practical examples 5 to 12, the range of the shadow from the evaporation source can be decreased by forming the end portions 62a and 62b of the upper portion 62 into a taper shape as shown in FIG. 14.

Conductive oxides such as ITO have a high resistance to the anisotropic dry etching shown in FIG. 9. Thus, in a case where a conductive oxide is used for the upper portion 62, the upper portion 62 is difficult to damage even when the width of the resist R1 is reduced during anisotropic dry etching as explained with reference to FIG. 16.

Regarding the aluminum and aluminum alloy shown as the examples of the materials of the metal layer 610 in practical examples 1 to 12, the width is easily reduced in the isotropic wet etching shown in FIG. 10, etc. Thus, the partition 6 having an overhang shape is easily formed. In addition, as the internal stress of aluminum and aluminum alloy at the time of formation is less, they may be made thick. For example, they may have a film thickness of 500 nm or greater.

When the lower portion 61 comprises the barrier layer 600 formed of molybdenum, molybdenum tungsten alloy, copper, etc., like practical examples 1 to 3, 5 to 7 and 9 to 11, the damage to the rib 5 can be prevented in the isotropic wet etching shown in FIG. 10.

For example, in the surrounding area SA, the lower portion 61 is connected to a power supply unit. The power supply unit may be formed of the same material as the lower electrode LE (LE1, LE2 and LE3). In this case, the surface layer of the power supply unit could consist of ITO. If the lower portion 61 does not comprise the barrier layer 600, the metal layer 610 formed of aluminum is in contact with ITO. In a structure in which aluminum is in contact with ITO, the problems of the high resistance of an interface and electrolytic corrosion may occur. To the contrary, in a case where the lower portion 61 comprises the barrier layer 600 formed of molybdenum, molybdenum tungsten alloy, copper, etc., even if the lower portion 61 is in contact with ITO, the high resistance or electrolytic corrosion described above is prevented.

Molybdenum alloy such as molybdenum tungsten alloy has a less internal stress at the time of formation. Thus, for example, compared to a case where the barrier layer 600 is formed of molybdenum, the thickness of the barrier layer 600 can be increased.

The structure disclosed in the present embodiment and each practical example can provide a display device DSP with excellent reliability and a manufacturing method thereof because of the various effects exemplarily shown above.

All of the display devices and manufacturing methods that can be implemented by a person of ordinary skill in the art through arbitrary design changes to the display device and manufacturing method described above as each embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:
a lower electrode;
a rib which covers part of the lower electrode and comprises an aperture overlapping the lower electrode;
a partition provided on the rib;
an upper electrode which faces the lower electrode and is in contact with the partition;
an organic layer located between the lower electrode and the upper electrode and emitting light based on a potential difference between the lower electrode and the upper electrode; and
a sealing layer located above the upper electrode, wherein
the partition comprises a lower portion provided on the rib, and an upper portion provided on the lower portion and comprising an end portion protruding from a side surface of the lower portion,
the upper portion includes a first layer formed of titanium and a second layer formed of a conductive oxide, and
the second layer is thinner than the first layer.

2. The display device of claim 1, wherein
the second layer covers the first layer.

3. The display device of claim 1, wherein
the conductive oxide forming the second layer is ITO, IZO or IGZO.

4. A display device comprising:
a lower electrode;
a rib which covers part of the lower electrode and comprises an aperture overlapping the lower electrode;
a partition provided on the rib;
an upper electrode which faces the lower electrode and is in contact with the partition;
an organic layer located between the lower electrode and the upper electrode and emitting light based on a potential difference between the lower electrode and the upper electrode; and
a sealing layer located above the upper electrode, wherein
the partition comprises a lower portion provided on the rib, and an upper portion provided on the lower portion and comprising an end portion protruding from a side surface of the lower portion, and
the upper portion comprises a single-layer structure of titanium.

5. A display device comprising:
a lower electrode;
a rib which covers part of the lower electrode and comprises an aperture overlapping the lower electrode;
a partition provided on the rib;
an upper electrode which faces the lower electrode and is in contact with the partition;
an organic layer located between the lower electrode and the upper electrode and emitting light based on a potential difference between the lower electrode and the upper electrode; and
a sealing layer located above the upper electrode, wherein
the partition comprises a lower portion provided on the rib, and an upper portion provided on the lower portion and comprising an end portion protruding from a side surface of the lower portion, and
the upper portion includes a first layer formed of titanium and a second layer formed of silicon oxide.

6. The display device of claim 5, wherein
the second layer covers the first layer.

7. The display device of claim 5, wherein
the second layer is thicker than the first layer.

8. The display device of claim 1, wherein
the lower portion contains aluminum.

9. The display device of claim 1, wherein
the lower portion includes a barrier layer provided on the rib, and a metal layer provided on the barrier layer.

10. The display device of claim 9, wherein
the barrier layer is formed of one of molybdenum, molybdenum tungsten alloy and copper.

11. The display device of claim 1, wherein
the side surface of the lower portion comprises projections and depressions.

12. A manufacturing method of a display device, the method comprising:
forming a lower electrode;
forming a rib which covers at least part of the lower electrode;
forming a partition comprising a lower portion provided on the rib, and an upper portion containing at least one of a conductive oxide and titanium and protruding from a side surface of the lower portion;
forming an organic layer on the lower electrode;
forming an upper electrode which is in contact with the partition and is located on the organic layer;
forming a sealing layer on the upper electrode;
forming a resist on the sealing layer; and
removing portions of the organic layer, the upper electrode and the sealing layer exposed from the resist by etching using the resist as a mask.

13. The manufacturing method of claim 12, wherein
the sealing layer is formed of silicon nitride.

14. The manufacturing method of claim 12, wherein
at least part of the partition is exposed from the resist.

15. The manufacturing method of claim 12, wherein
the forming the partition includes:
forming a metal layer on the rib;
forming the upper portion on the metal layer;
reducing a thickness of a first portion of the metal layer exposed from the upper portion by anisotropic etching; and
forming the lower portion by reducing a width of a second portion of the metal layer located under the upper portion by isotropic etching.

16. The manufacturing method of claim 12, wherein
the upper portion includes a first layer formed of titanium and a second layer formed of a conductive oxide.

17. The manufacturing method of claim 12, wherein
the upper portion comprises a single-layer structure of titanium.

18. The manufacturing method of claim 12, wherein
the upper portion includes a first layer formed of titanium and a second layer formed of silicon oxide.

* * * * *